United States Patent [19]

Redwine

[11] Patent Number: 5,510,298
[45] Date of Patent: Apr. 23, 1996

[54] METHOD OF INTERCONNECT IN AN INTEGRATED CIRCUIT

[75] Inventor: Donald J. Redwine, Houston, Tex.

[73] Assignee: Texas Instruments Incorporated, Dallas, Tex.

[21] Appl. No.: 304,628

[22] Filed: Sep. 12, 1994

Related U.S. Application Data

[63] Continuation of Ser. No. 132,425, Oct. 5, 1993, abandoned, which is a continuation of Ser. No. 758,653, Sep. 12, 1991, abandoned.

[51] Int. Cl.$^6$ ............................ H01L 21/44; H01L 21/48
[52] U.S. Cl. ........................ 437/203; 437/195; 437/192; 437/245
[58] Field of Search ........................ 437/203, 192, 437/245; 257/767, 773, 776, 970, 758, 763

[56] References Cited

U.S. PATENT DOCUMENTS

| | | | |
|---|---|---|---|
| 4,541,168 | 9/1985 | Galie et al. | 437/67 |
| 4,728,623 | 3/1988 | Lu et al. | 437/52 |
| 4,745,081 | 5/1988 | Beyer et al. | 437/38 |
| 4,879,257 | 11/1989 | Patrick | 437/195 |
| 4,903,189 | 2/1990 | Ngo et al. | 363/127 |
| 4,910,572 | 3/1990 | Kameyama | 357/34 |
| 4,916,524 | 4/1990 | Teng et al. | |
| 4,977,439 | 12/1990 | Esquivel et al. | 257/621 |
| 5,075,753 | 12/1991 | Kozono | 257/758 |
| 5,098,862 | 3/1992 | Ditchek et al. | 437/203 |
| 5,181,089 | 1/1993 | Matsuo et al. | 257/299 |

FOREIGN PATENT DOCUMENTS

| | | | |
|---|---|---|---|
| 62-105461 | 5/1987 | Japan | 257/758 |
| 63-124542 | 5/1988 | Japan | 437/203 |
| 63-261848 | 10/1988 | Japan | 437/203 |

OTHER PUBLICATIONS

T. Sakurai and K. Tamaru "Simple Formulas for Two- and Three-Dimensional Capacitances" IEEE Transactions on Electron Devices vol. Ed. 30, No. 2, Feb. 1983, pp. 183–185.
Wolf, Silicon Processing for the VLSI Era, vol. 2–Process Integration pp. 143–144, 1990, Lattice Press.

*Primary Examiner*—Olik Chaudhuri
*Assistant Examiner*—H. Jey Tsai
*Attorney, Agent, or Firm*—William W. Holloway; Rich Donaldson; Leo Heiting

[57] ABSTRACT

An integrated circuit interconnect structure is provided, along with a method of forming the integrated circuit interconnect structure. A semiconductor material layer has an elongate trench formed therein. A conducting region is disposed in the trench. An insulator region overlies the conducting region. One or more contact regions are disposed through the insulator region to contact the conducting region.

12 Claims, 2 Drawing Sheets

METHOD OF INTERCONNECT IN AN INTEGRATED CIRCUIT

This application is a Continuation of application Ser. No. 08/132,425, filed Oct. 5, 1993, abandoned, which is a Continuation of application Ser. No. 07/758,653, filed on Sep. 12, 1991, abandoned.

TECHNICAL FIELD OF THE INVENTION

This invention relates in general to integrated circuits and in particular to a method and structure of interconnect in an integrated circuit.

BACKGROUND OF THE INVENTION

As linear dimensions continue to decrease on integrated circuits, interconnections between components become increasingly difficult. Metal layers are frequently used as interconnections for signal routing and for power bus distribution. In many instances, decreasing linear dimensions of such a metal layer may increase the intrinsic time constant associated with these interconnect lines, thereby impairing response times for the circuit. Also, fringing capacitance increases whenever these metal lines are placed closer to each other. Since minimum spacing between lines is almost always used, this further increases the intrinsic time constant associated with these lines.

Power bus distribution lines are usually very wide and consume large amounts of area on the integrated circuit. For example, power bus distribution lines usually must be slotted when they are routed around corners, so that shear stresses resulting from the interface between the metal line and compressive nitride protective overcoat may be prevented from moving the metal line and causing a failure. When metal lines are slotted, even more surface area is required to achieve the same amount of resistance per unit length for the bus.

Therefore, a need has arisen for a method and structure of interconnect in an integrated circuit which decreases linear dimensions of the integrated circuit without significantly impairing circuit performance.

SUMMARY OF THE INVENTION

An integrated circuit interconnect structure comprises a semiconductor material layer having an elongate trench formed therein. A conducting region is disposed in the trench. An insulator region overlies the conducting region. One or more contact regions are disposed through the insulator region to contact the conducting region.

It is a technical advantage of this aspect of the present invention that linear dimensions of an integrated circuit may be decreased without significantly impairing response times for the circuit.

It is a further technical advantage of this aspect of the present invention that fringing capacitance between metal lines is substantially avoided.

It is another technical advantage of this aspect of the present invention that the resistance of an interconnection is reduced by maintaining a wide current path.

In yet another technical advantage of this aspect of the present invention, it is unnecessary to slot metal lines when they are routed around corners.

A still further technical advantage of this aspect of the present invention is that semiconductor chip die area above metal lines may be used for routing signal lines, thereby saving considerable layout area in a semiconductor chip design.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
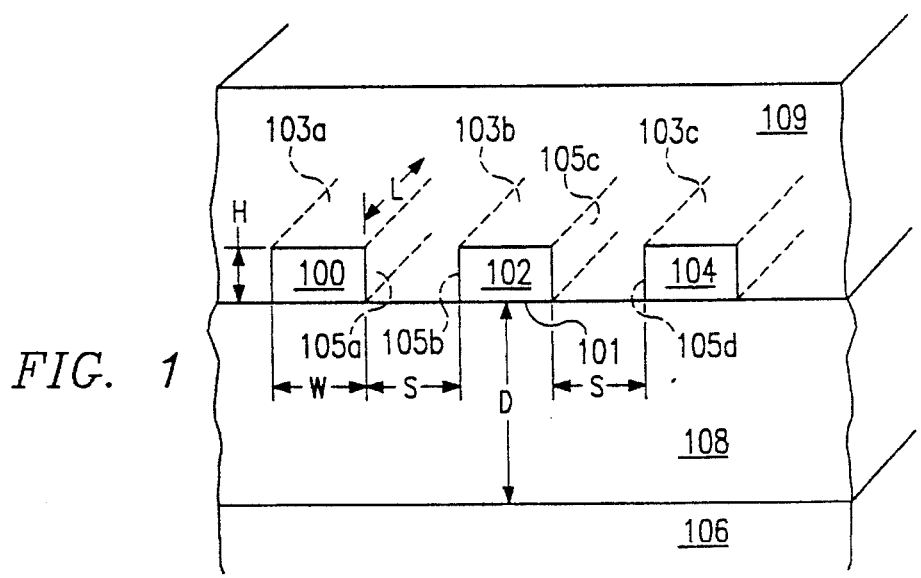
FIG. 1 illustrates dimensions and spacing of parallel metal lines in a typical integrated circuit.

The preferred embodiment of the present invention and its advantages are best understood by referring to FIGS. 1–3 of the drawings, like numerals being used for like and corresponding parts of the various drawings.

FIG. 1 illustrates dimensions and spacing of parallel metal lines in a typical integrated circuit. Metal lines 100, 102 and 104 each have a height H, width W, and length L. Metal lines 100, 102 and 104 are each separated from silicon 106 by oxide 108 having a thickness D. Oxide 109 also separates metal line 100 from metal line 102 by distance S, and oxide 109 further separates metal line 102 from metal line 104 by distance S.

In a first typical 16-megabyte DRAM chip, height H is 0.50 micrometers and width W is 0.6 micrometers. In a second typical 16-megabyte DRAM chip, height H is 1 micrometer and width W is also 1 micrometer. Consequently, in both typical DRAM chips, width W is approximately equal to height H, thereby tending to increase fringing capacitance. Moreover, in both typical DRAM chips, spacing S between metal lines 100, 102 and 104 is approximately 1 micrometer, further tending to increase fringing capacitance. For signal lines, fringing capacitance is undesirable, since it results in crosstalk (noise) between these signal lines.

Moreover, the intrinsic time constant ($\tau_i$) of each metal line 100, 102 and 104 is represented by $$\tau_i \cong R\ C_{Line}/2 \qquad \text{(Eq. 1)}$$

The capacitance $C_{Line}$ for each of metal lines 100, 102 and 104 is represented by $$C_{Line} \cong C_{BD} + 2C_{SS} + C_F \qquad \text{(Eq. 2)}$$

where, for example, $C_{BD}$ is capacitance between silicon 106 and bottom surface 101 of metal line 102 over distance D, where $2C_{SS}$ is capacitance between surface 105b of metal line 102 and surface 105a of metal line 100 over distance S and also between surface 105c of metal line 102 and surface 105d of metal line 104 over distance S, and where $C_F$ is fringing capacitance of top surface 103b of metal line 102 to top surfaces 103a and 103c of metal lines 100 and 104, respectively.

For metal line 102 in FIG. 1, Equation 2 may be represented as $$C_{Line} \approx \left(\frac{\epsilon_{ox}}{D}\right) WL + 2 \left(\frac{\epsilon_{ox}}{S}\right) HL + \gamma \left(\frac{W}{H}\right) L \quad \text{(Eq. 3)}$$

where $\epsilon_{ox}$ is the dielectric constant for oxides 108 and 109, and where $\gamma$ is the fringing constant for each of top plates 103a–c.

Consequently, Equation 1 may be rewritten as $$\tau_i \approx \quad \text{(Eq. 4)}$$

$$\frac{1}{2} \left(\frac{\rho L}{HW}\right) \left[ \left(\frac{\epsilon_{ox}}{D}\right) WL + 2 \left(\frac{\epsilon_{ox}}{S}\right) HL + \gamma \left(\frac{W}{H}\right) L \right]$$

where $$R = \frac{\rho L}{HW} \quad \text{(Eq. 5)}$$

and where Equation 3 is substituted for $C_{Line}$.

Equation 4 may be rearranged such that $$\tau_i \approx \frac{1}{2} \frac{\rho \epsilon_{ox} L^2}{HD} + \frac{\rho \epsilon_{ox} L^2}{WS} + \frac{1}{2} \frac{\rho \gamma L^2}{H^2} \quad \text{(Eq. 6)}$$

Hence, $\tau_i$ increases as the square of length L.

In Equation 6, as H increases, while the other factors remained fixed, the intrinsic time constant $\tau_i$ approaches $$\tau_i \approx \frac{\rho \epsilon_{ox} L^2}{WS} \quad \text{(Eq. 7)}$$

In this situation, if W decreases or if S decreases, then intrinsic time constant $\tau_i$ will increase and consequently will impair response times for the circuit. Therefore, reducing linear dimensions of the integrated circuit by shortening W or S is not preferred. Moreover, resistivity $\rho$ and dielectric constant $\epsilon_{ox}$ are substantially constant. Also, in typical applications, L will be constant or possibly will increase slightly. Therefore, a method for decreasing linear dimensions of the integrated circuit is desirable in which response times for the circuit will not be significantly impaired.

If the end of a metal line, such as metal line 102, is connected to a node having a significant fixed capacitance $C_{fixed}$, then $C_{Line}$ of the metal line will be relatively negligible. For example, $C_{fixed} \gg C_{Line}$ occurs when an element such as an address buffer/inverter is connected to a first end of a metal line for driving a signal to another element, such as an address decoder attached to a second end of the metal line. Hence, $C_{fixed} \gg C_{Line}$ and therefore $$\tau \approx \frac{\rho L}{HW} C_{fixed}$$

In this situation, for a fixed W and L, if H of the metal line increases then the time constant $\tau$ decreases. Consequently, by increasing H, faster response times are obtained for the integrated circuit without increasing width W and without decreasing length L.

Figure 2A:
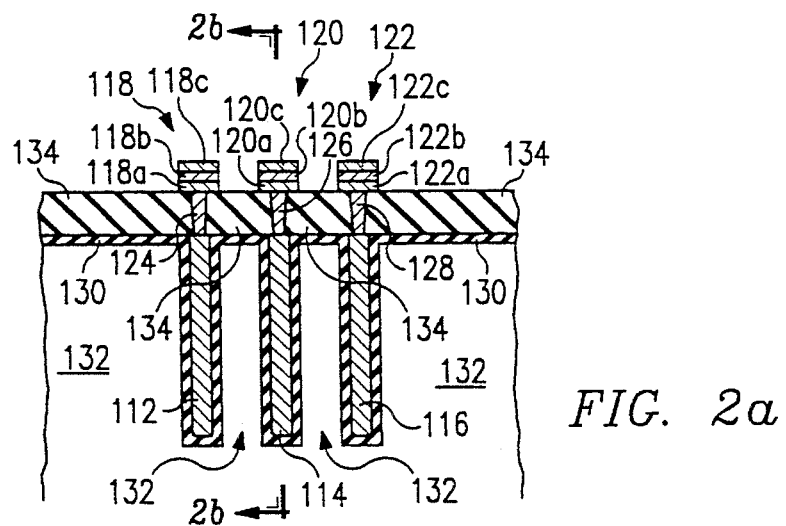
FIGS. 2a to 2b illustrate perspective views of an interconnecting system in accordance with the preferred embodiment.
Figure 2B:
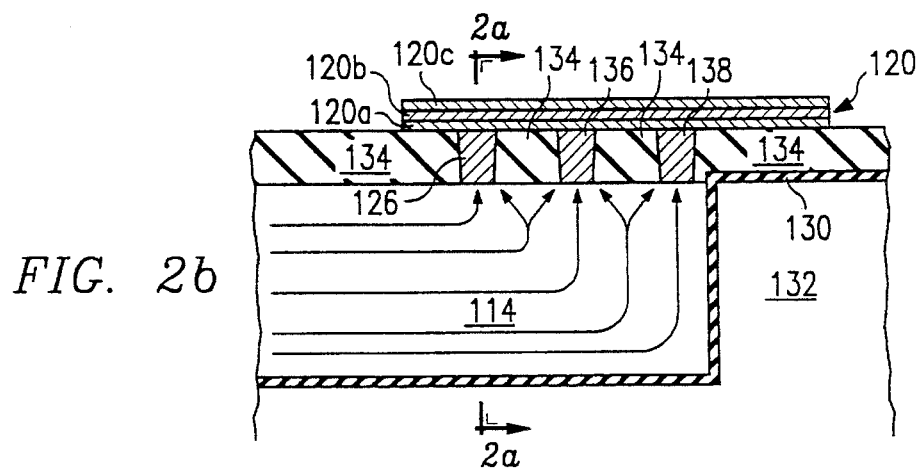

FIGS. 2a–b illustrate perspective views of an interconnecting system in accordance with the preferred embodiment. In FIG. 2a, parallel metal lines 112, 114 and 116 are connected to metal lines 118, 120 and 122, respectively, by CVD tungsten plugs 124, 126 and 128, respectively. Metal lines 112, 114, and 166 are parallel to metal lines 118, 120, and 122. Silicon dioxide ("oxide"), or alternatively silicon nitride, layer 130 and P-type silicon 132 isolate metal lines 112, 114 and 116 such that fringing capacitance between sidewalls of metal lines 112–116 is substantially avoided, thus preventing electrical crosstalk (noise) between metal lines 112, 114 and 116. Electric fields from the sidewalls of metal lines 112–116 terminate in silicon 132. Consequently, adjacent metal lines 112 and 114, and also 114 and 116, are not capacitively coupled. Moreover, inter-level oxide 134 isolates metal lines 112–116 from metal lines 118–122, except in locations where tungsten plugs 124–128 provide interconnections, thus allowing other metal lines to run across metal lines 112, 114 and 116.

FIG. 2b illustrates a second perspective view of the buried interconnect metalization system from the perspective indicated in FIG. 2a. Likewise, FIG. 2a illustrates a view from the perspective indicated in FIG. 2b. In FIG. 2b, inter-level oxide 134 isolates metal line 114 from metal line 120, except where tungsten plugs 126, 136 and 138 connect metal line 114 to metal line 120. As FIG. 2b illustrates, several tungsten plugs 126, 136 and 138 may be utilized at multiple nodes to provide a parallel connection between metal line 114 and metal line 120. In FIG. 2b, the inclusion of several tungsten plugs connecting metal line 114 to metal line 120 reduces the resistance of the interconnection by maintaining a wide current path. Moreover, if each of metal lines 112–116 are connected in parallel, then a metal bus equivalent to 28.5 micrometers (3×9.5 micrometers) in height is formed. In an alternative embodiment, a first metal line substantially perpendicular to metal line 114 is connected to tungsten plug 126, a second metal line substantially perpendicular to metal line 114 is connected to tungsten plug 136, and a third metal line is connected to tungsten plug 138, thereby connecting a single metal line 114 to multiple other metal lines.

Figure 3A:
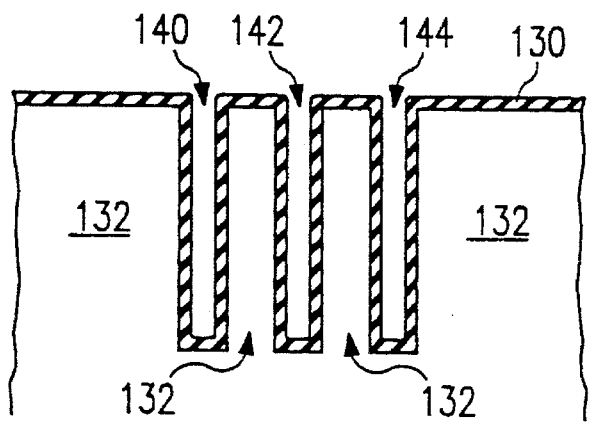
FIGS. 3a to 3c illustrate process steps for forming the interconnecting system in accordance with the preferred embodiment.
Figure 3B:
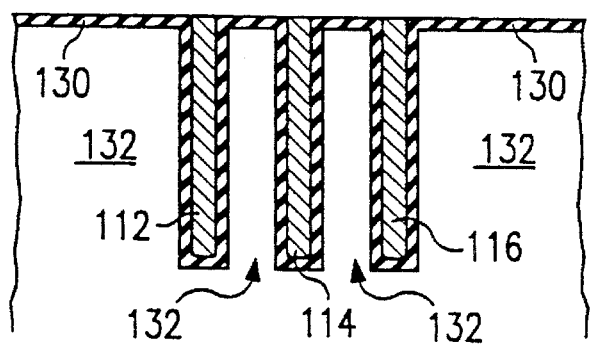
Figure 3C:
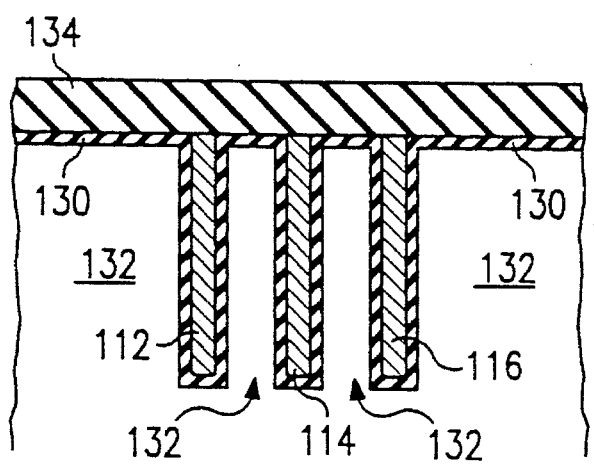

FIGS. 3a–c illustrate processing steps for forming the interconnecting system in accordance with the preferred embodiment. Trenches 140, 142 and 144 are cut to a depth of approximately 10 micrometers and to a width of approximately 2 micrometers in P-type silicon layer 132. Each of trenches 140–144 extend down the length of a semiconductor chip. The length of a typical semiconductor chip die may be 6,000–7,000 micrometers. Trenches 140–144 are separated by approximately 1 micrometer of silicon 132. After cutting trenches 140–144, Boron P+channel stop (not shown) is formed at the surfaces of trenches 140–144. Oxide layer 130 is then deposited or grown to a thickness of approximately 0.5 micrometers. As shown in FIG. 3b, tungsten metal lines 112, 114 and 116 are then deposited and etched to fill trenches 140–144, respectively.

In FIG. 3c, inter-level oxide 134 is then deposited at a thickness of approximately 2 micrometers.

Referring again to FIG. 2a, vias are then cut in inter-level oxide 134 and filled by tungsten plugs 124, 126 and 128 (shown in FIG. 2a) and by tungsten plugs 136 and 138 (shown in FIG. 2b). Each of tungsten plugs 124, 126, 128, 136 and 138 has a width of approximately 0.6 to 0.8 micrometers. Metal lines 118, 120 and 122 are then deposited as shown in FIG. 2a. Metal lines 118–122 are separated by approximately 2 micrometers. Each of metal lines 118–122 has a lateral width of approximately 1 micrometer. Each of metal lines 118– 122 comprises three layers having an aggregate thickness of approximately 1 micrometer. Layers 118A, 120A and 122A are formed of titanium tungsten. Layers 118B, 120B and 122B are formed of CVD-tungsten. Layers 118C, 120C and 122C are formed of aluminum.

In the preferred embodiment, it is unnecessary to slot metal lines when they are routed around corners, because metal lines 112–116 are entirely buried underneath inter-level oxide 134 and are laterally supported by silicon 132. Consequently, metal lines 112– 116 are not affected by shear stress that might otherwise be caused by a different thermal expansion coefficient of compressive nitride protective overcoat. Moreover, by burying metal lines 112–116, and by contacting metal lines 118–122 at tungsten plug locations 124–128, it is unnecessary for tungsten plugs 124–128 to extend down the entire length of a semiconductor chip die, thereby allowing semiconductor chip die area above metal lines 112–116 to be used for routing signal lines and consequently saving considerable layout area in a semiconductor chip design.

Although the present invention and its advantages have been described in detail, it should be understood that various changes, substitutions and alterations can be made herein without departing from the spirit and scope of the invention as defined by the appended claims.

What is claimed is:

1. A method of forming an integrated circuit interconnect structure, said method comprising the steps of:

forming first and second elongate trenches in a semiconductor substrate layer;

forming a conducting region in each of said first and second elongate trenches to form a first conducting region and a second conducting region;

forming an insulator region overlying each said conducting region, said first and second conducting regions adapted for conduction of current parallel to said insulator regions;

forming a first and a second conducting line overlying said insulator region, said first and said second conducting line are parallel to said first and said conducting regions respectively; and forming two or more contact regions through each of said insulator regions to couple electrically in parallel said first conducting region with said first conducting line and to couple electrically said second conducting region with said second conducting line.

2. The method of claim 1 and further comprising the step of forming said first and second elongate trenches to have a depth of at least four times their widths.

3. The method of claim 1 wherein said conducting line forming step comprises the step of forming a portion of said conducting line perpendicular to a portion of said trench.

4. The method of claim 1 and further comprising the step of forming a second insulator region in said trench between said semiconductor material and said conducting regions.

5. A method of forming an integrated circuit interconnect structure, said method comprising the steps of:

forming plural elongate trenches in a semiconductor material layer;

forming a conducting region in each of said elongate trenches;

forming a first insulator region overlying each said conducting region in said trenches, wherein said conducting region in each of said elongate trenches is adapted for conduction of current parallel to said first insulator region;

forming a second insulator region in each of said elongate trenches between said semiconductor material and said conducting region;

forming one or more conducting lines overlying said first insulator region overlying each said conducting region; and forming at least two contact regions through said first insulator region overlying each said conducting region to connect electrically in parallel each said conducting region to at least one said conducting line.

6. The method of claim 5 wherein said forming an elongate trench step includes the step of forming said elongate trench such that a depth of said elongate trenches is at least four times deeper than a width of said elongate trenches.

7. The method of claim 5 wherein said conducting line forming step comprises the step of forming said conducting line substantially parallel to said trench.

8. The method of claim 5 wherein said conducting line forming step comprises the step of forming a portion of said conducting line substantially perpendicular to said trench.

9. A method of controlling the frequency response of a conducting strip of an interconnect structure, said method comprising the steps of:

forming a metal line in a semiconductor material layer;

forming an insulating layer over said metal line;

forming at least one conducting via in said insulating layer, said conducting via being electrically coupled to said metal line by a plurality of conducting contacts;

forming said conducting strip on said insulating layer, said conducting strip being coupled in parallel electrically to said conducting via.

10. The method of claim 9 further including the step of using said semiconductor material layer to isolate capacitively said metal line from another metal line formed in said semiconductor material.

11. The method of claim 9 wherein said forming a metal line step includes the step of fabricating a depth dimension for said metal line greater than a width dimension.

12. The method of claim 9 wherein said forming a metal line step includes a step of forming said metal line parallel to said conducting strip.

* * * * *